United States Patent
Kumar

(10) Patent No.: US 7,924,194 B2
(45) Date of Patent: Apr. 12, 2011

(54) USE OF THREE PHASE CLOCK IN SIGMA DELTA MODULATOR TO MITIGATE THE QUANTIZATION NOISE FOLDING

(75) Inventor: Ajay Kumar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/549,355

(22) Filed: Aug. 27, 2009

(65) Prior Publication Data

US 2011/0050471 A1   Mar. 3, 2011

(51) Int. Cl.
*H03M 3/00* (2006.01)
(52) U.S. Cl. .......................... 341/143; 341/155; 341/144
(58) Field of Classification Search .................. 341/155, 341/143, 144
See application file for complete search history.

(56) References Cited

U.S. PATENT DOCUMENTS

| 6,501,322 B1 * | 12/2002 | Bidenbach et al. ............ 327/336 |
| 6,614,375 B2 * | 9/2003 | Hochschild .................... 341/143 |
| 2005/0116850 A1 | 6/2005 | Hezar et al. |

OTHER PUBLICATIONS

Abhijit Das, et al., "A 4th-order 86dB CT Delta-Sigma ADC with Two Amplifiers in 90nm CMOS", 2005 IEEE International Solid-State Circuits Conference, , Feb. 9, 2005, Salon 7, Session 27, Filters and Continous-Time Delta-Sigma Converters, 27.3, pp. 496, 497 & 612.

* cited by examiner

*Primary Examiner* — Brian Young
(74) *Attorney, Agent, or Firm* — John R. Pessetto; W. James Brady; Frederick J. Telecky, Jr.

(57) ABSTRACT

A differential sigma delta modulator operates by modulating an input signal by intermittently coupling a reference signal to the input signal using one or more switches controlled by one or more feedback signals and a respective one or more non-overlapping clock signals. The modulated input signal is integrated using an integration capacitor to form an integrated value and the integrated value is compared to a threshold to form the one or more feedback signals. Parasitic capacitance of the one or more switches is initialized to an initial value prior to each intermittent coupling of the reference signal to the input signal using another non-overlapping clock signal.

17 Claims, 9 Drawing Sheets

US 7,924,194 B2

USE OF THREE PHASE CLOCK IN SIGMA DELTA MODULATOR TO MITIGATE THE QUANTIZATION NOISE FOLDING

FIELD OF THE INVENTION

This invention generally relates to analog to digital converters and more particularly to continuous time delta sigma analog-to-digital data converters.

BACKGROUND OF THE INVENTION

Analog-to-digital converters (ADC) are used to convert analog signals into a digital representation of the same signal. ADCs are used in a wide variety of applications, ranging from medical and entertainment to communications (both voice and data). Analog to digital (A/D) converters are electrical circuit devices that convert continuous signals, such as voltages or currents, from the analog domain to the digital domain, in which the signals are represented by numbers. A variety of A/D converter types exist, including flash A/Ds, sub-ranging A/Ds, successive approximation A/Ds, and integrating A/Ds. Another type is known as a sigma delta or delta sigma ($\Delta\Sigma$) A/D converter, which includes a delta sigma modulator that samples an analog signal at a very high sampling rate (oversampling) in order to perform a noise shaping function. The oversampling is commonly performed at a multiple of the Nyquist rate ($F_N$) for a given input signal frequency and typically the sampling frequency $F_S$ is 10 to 1000 times $F_N$. In this manner, quantization noise power is spread over a bandwidth equal to the sampling frequency, thereby reducing the noise density in the band of interest. Digital filtering is then employed on the digital output to achieve a high resolution. Decimation may then be employed to reduce the effective sampling rate back to the "Nyquist" rate. Delta sigma data converters also typically include a loop filter in the forward signal path that operates to push some of the quantization noise into the higher frequency spectrum beyond the band of interest.

Sigma-delta ADCs are commonly used in applications where high resolution with low to moderate conversion rates are required. An advantage of sigma-delta ADCs is that the sigma-delta ADCs normally make use of single or low multi-bit (two, three, or four bit) quantizers, making the precision requirements of the sigma-delta ADC much lower than other types of ADCs that may use quantizers with a large number of bits (eight or greater). Operating at a frequency greater than the required frequency is commonly referred to as oversampling and an ADC that is operating at a frequency that is K times greater than the required frequency is referred to as a K-times oversampling ADC.

Mobile audio devices are a ubiquitous fixture of modern society. Cellular telephones, personal music players, portable gaming systems, etc. are constant companions for many people. Cell phones continue to increase in computer processing capability and sophistication. The basic radio receiver within the cell phone may make use of a sigma-delta ADC for signal reception and demodulation. The increased memory capacity and computing resources on a cell phone support the installation of various applications, often referred to as "apps" that allow a diverse range of functions to be performed by the cell phone when not being used for conversation. Analog to digital conversion is required by several apps that run on a mobile device and may be performed by a sigma-delta ADC.

US Patent publication 2005/0116850 describes a fourth order delta sigma analog-to-digital converter that has a passive delta sigma modulator including a passive filter, a quantizer, and a digital-to-analog converter in a first feedback loop, and an active filter having a large gain factor in a second feedback loop around the passive delta-sigma modulator.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

It has now been discovered that in a conventional differential two-phase non-overlapping data sigma-delta analog to digital converter (SD-ADC), parasitic capacitance at the output of the feedback digital to analog converter (DAC) with differential offset voltage folds a scaled Quantization noise in-band. This scaling factor is a ratio of the parasitic capacitor to the integrating capacitor. The folded Quantization noise raises the noise floor and thus limits the maximum achievable signal to noise ratio (SNR) from the ADC. This folded Quantization noise is indistinguishable from thermal noise generated within the ADC. This folding mechanism also steals a portion of the feedback DAC current and reduces the maximum signal handling capacity. This folding operation also mixes the charge from the positive to the negative terminal of the second integrator and causes harmonic distortion. Most likely, every differential SD-ADC suffers from this problem. It is hard to simulate, as neither offset nor parasitic capacitance alone shows this problem. With currently available simulators, an offset cannot be added to an extracted view, so even extracted simulation does not catch this problem. In reality, every differential part has some offset, so the measured SNR is always less than the simulated.

To overcome this newly discovered problem, a three phase non-overlapping data clock may be used in an SD-ADC, where a middle phase is used to reset the parasitic capacitance to a common mode voltage and remove the signal, noise dependent charge and offset from the parasitic capacitor. By doing so, it solves the three problems at once. In this innovative scheme, the parasitic capacitor has common mode voltage, therefore its contribution is also shaped the same as the quantization noise. The SNR and SNDR (signal to noise plus distortion ratio) of the three phase SD-ADC matches well the mathematical model and shows approximately 6-10 dB improvement in performance.

Figure 1:
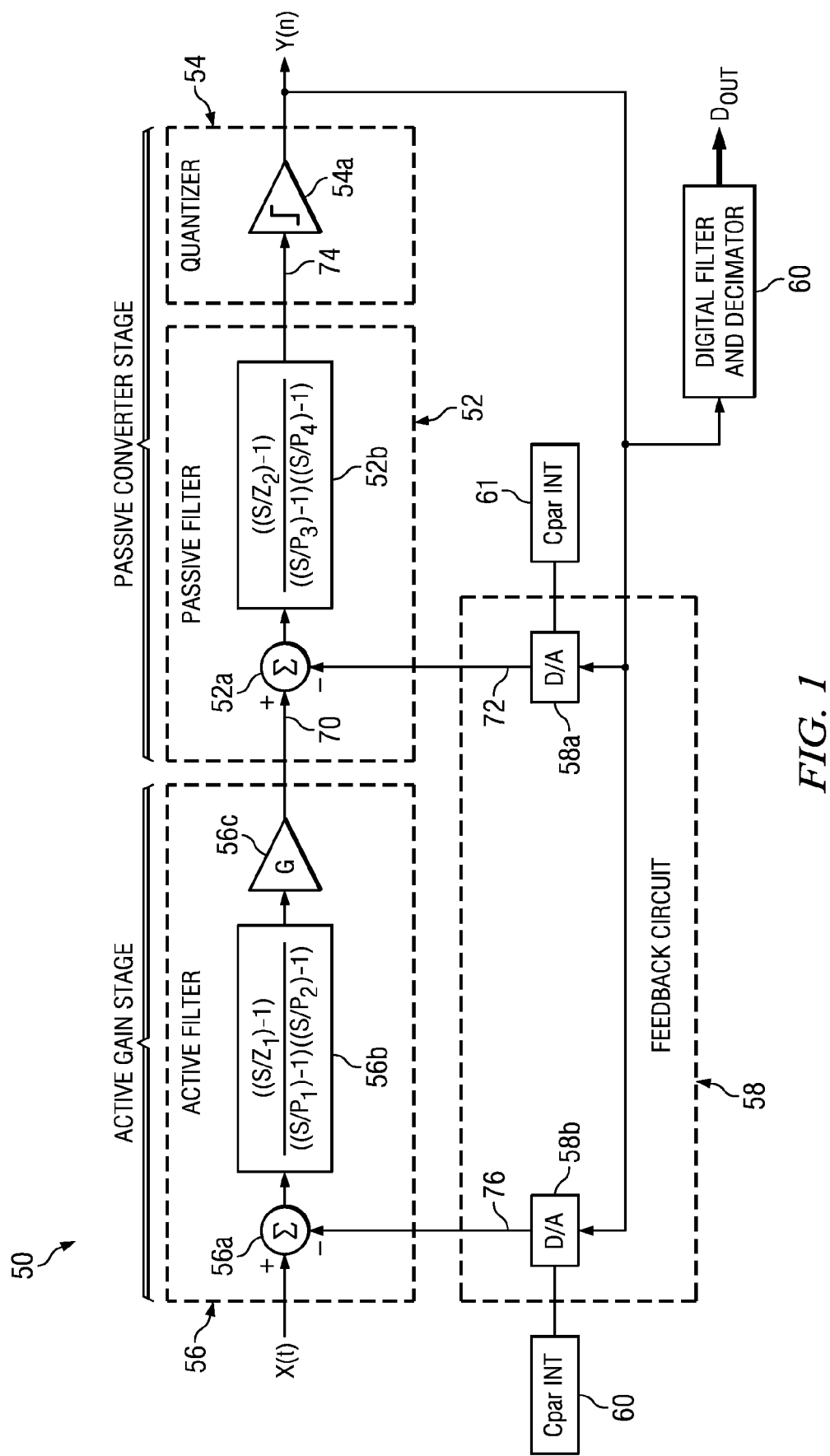
FIG. 1 is a schematic diagram of an embodiment of the invention illustrating an exemplary fourth order delta sigma analog-to-digital converter having a passive converter stage and an active gain stage in an outer feedback loop around the passive converter.

In order to understand the operation of an SD-ADC, a simplified block diagram of an exemplary SD-ADC 50 is shown in FIG. 1. Exemplary delta sigma analog to digital conversion system 50 comprises a passive filter 52 and a quantizer 54 in a forward signal path of a passive delta sigma converter stage or circuit. System 50 further comprises an active filter 56 in an active feedback gain stage or circuit along the forward signal path, and a feedback circuit 58 in a feedback signal path, including first and second switched capacitor or switched current or switched resistor digital-to-analog (D/A) converters 58a and 58b.

Filter 56 comprises a summing junction 56a and a second low pass filter 56b, also free of switching components, as well as an amplifier 56c, such as an operational amplifier or other amplifier circuit. While the amplifier 56c is illustrated in FIGS. 1 and 2 as a single component, various types of amplifiers may be employed. The amplifier 56c, moreover, may include multiple components, for example, an operational amplifier with resistances in a feedback loop (not shown) to set the amplifier gain factor, where Gm is a transconductance gain. A transconductance amplifier (gm amplifier) puts out a current proportional to its input voltage. In network analysis, the transconductance amplifier is defined as a voltage controlled current source (VCCS). Filter 56b in the feedback stage may, but need not, be designed with poles and zero(s) corresponding to those of the first filter 52b.

In operation, filter 52 receives a converter stage analog input 70 and a first analog feedback signal 72 at the summing circuit 52a, and provides a first filtered analog signal 74 as an input signal to the quantizer 54 according to the difference between the converter stage input 70 and the first feedback signal 72. Quantizer 54 provides quantized output Y(n) according to filtered analog signal 74, and D/A 58a provides analog feedback signal 72 according to the quantized output Y(n). Filter 56 in the gain stage receives the system input X(t) and provides the converter stage analog input 70 via the second filter 56b and the amplifier 56c according to the difference between the system input X(t) and a second feedback signal 76 from the second D/A 58b scaled by the gain factor of the amplifier 56c.

In system 50, amplifier 56c has a high gain times bandwidth product, wherein the gain of the active filter 56 and the bandwidth of the filter poles are set according to the amplifier gain-bandwidth product and the desired frequency band for a given application. In the illustrated example, the poles and zeroes of filters 52b and 56b generally correspond with one another, although strict pole and zero matching are not required. Further, the illustrated filters 52b and 56b are both second order low pass filters, although filters of other orders and other types (e.g., bandpass), may be used in other embodiments of the invention.

Any noise associated with the input of the quantizer 54 and passive filter 52 are reduced by the gain factor of the amplifier 56c. This is an improvement over conventional passive delta sigma designs, in which the quantizer input noise was not noise shaped. Thus, the gain of the amplifier 56c in the system 50 is high, such as greater than about 25, for example. In the present embodiment, the gain is approximately 100. In addition, converter 50 may be adapted for use in a variety of applications across a wide bandwidth range, wherein the gain and pole/zero locations in the system 50 can be selected for operation in cellular communications devices compatible with GSM (Global System for Mobile Communications) having bandwidths of a few hundred kHz up to video or GPS devices using bandwidths of up to 5 MHz or more.

Figure 2A:
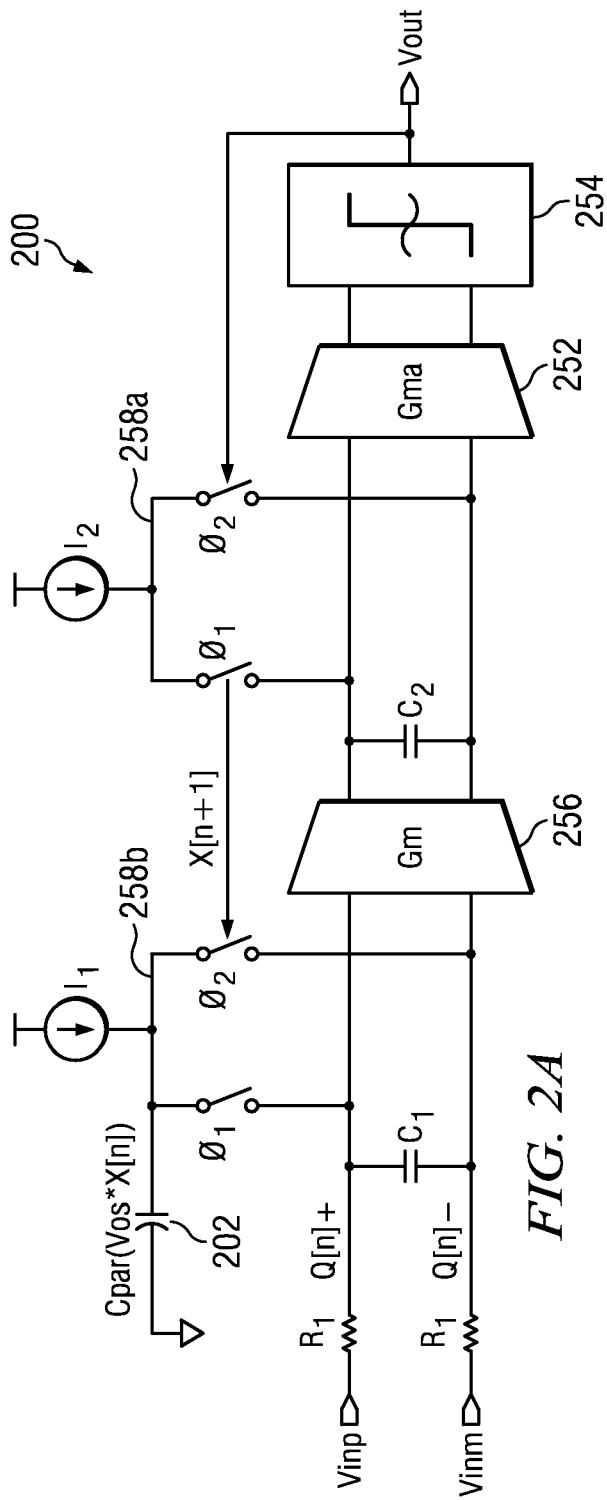
FIGS. 2A and 2B are a block diagram and a timing diagram, respectively, illustrating basic two-phase operation of a differential SD-ADC without parasitic capacitance initialization.
Figure 2B:
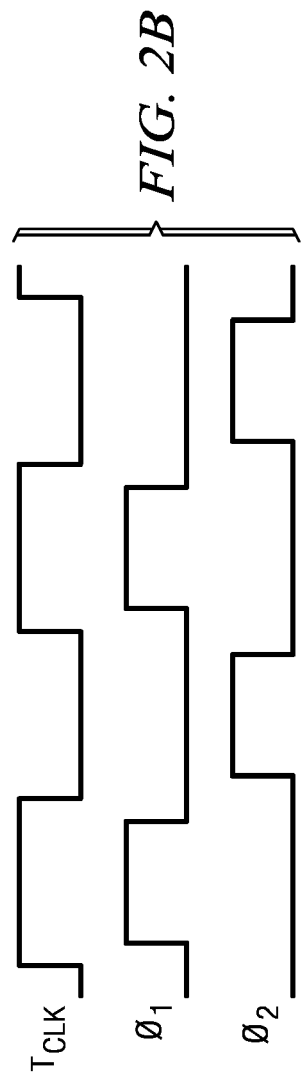

As mentioned above, it has now been discovered that in a conventional differential two-phase non-overlapping SD-ADC, parasitic capacitance in the feedback digital to analog converter (DAC) along with differential offset voltage folds a scaled Quantization noise in-band. This scaling factor is a ratio of the parasitic capacitor to the integrating capacitor. In order to better explain the operation of embodiments of the present invention, FIGS. 2A and 2B are a block diagram and a timing diagram, respectively, illustrating basic two-phase operation of a simple $2^{nd}$ order differential SD-ADC without parasitic capacitance initialization. In this embodiment, passive filter 52 of FIG. 1 is replaced with a second active filter 252, but otherwise the operation of SD-ADC 200 is similar to that of SD-ADC 50. Differential voltage inputs Vinp and Vinm are applied to input resistors R1 in each differential input and integrate across capacitor C1. Switches 258b and current source 11 form a feedback DAC responsive to output signal Vout from quantizer 254 whose output is summed with the input signals Vinp, Vinm across integration capacitor C1. Switches 258b are controlled by non-overlapping clock signals $\phi 1$ and $\phi 2$, as illustrated in FIG. 3B. Both resistors R1, capacitor C1, amplifier 356 and capacitor C2 thus form an active $2^{nd}$ order filter similar to filter 56 of FIG. 1. Input noise associated with the input of the quantizer 254 is reduced by the gain factor Gm of amplifier 256, as discussed above.

Within any circuit, parasitic capacitance may be formed between signal lines and circuit features of each device in a circuit with respect to a ground substrate within an integrated circuit. Parasitic capacitor 202 represents the parasitic capacitance that is associated with switching devices 258b, the current source 11 and trace-capacitance. Parasitic capacitor Cpar 202 stores +Vos or −Vos depending upon output signal Vout from quantizer 254 during the prior cycle X[n], depending on whether Vout is +1 or −1. A charge is formed on Cpar 202 as follows:

Charge on Cpar=Qcpar=Cpar.Vos.X[n]

X[n]=Sig [n]+Q[n]

where:
Sig[n] is Signum function which gives +1 or −1 output based on input-signal if it is >0 or <0
Q[n] is the quantization noise.
Q[n] is a random quantization noise and is uniformly distributed between $\pm\Delta/2$, so mean square value is $\Delta^2/12$. In this case $\Delta=1$. Therefore, Q[n]*Q[n]=$\Delta^2$/12=1/12

Current from the parasitic capacitor Cpar is as follows:
Icpar=QCpar/T where T is the period time of each sampling cycle In 1-bit DS modulator, the quantization noise is ±1. The maximum signal strength is also ±1. The basic concept of DS modulator is: it gives a low-pass response to the input signal and a high pass response to quantization noise. Thus it pushes the quantization noise to fclk/2 corresponding to the order of the loop. A 2nd order loop produces 40 db/decade, 3rd order produces 60 dB/decade, etc. The parasitic cap at the output of first DAC 258b convolves the quantization to itself. When convolving the high-pass shaped quantization noise to itself it again becomes flat in the entire band, thus the quantization noise is folded-back to in-band. In DS modulator terminology, in-band is pass-band of modulator. Other embodiments could be low-pass, bandpass, or highpass.

Current I1 from the feedback DAC and Icpar get multiplied by X[n+1] in each cycle. Thus, charge transferred due to parasitic capacitor, referred to as folded charge Qfolding is:

$$Q_{folding} = C_{par}V_{os}X[n] \cdot X[n+1]$$
$$\approx C_{par}V_{os}Q[n] \cdot Q[n+1]$$
$$= C_{par}V_{os}Q[f] * Q[f]$$

$$SNR_{folding} = \frac{I_1}{I_{folding}} = \frac{I_1 \times \tau}{Q_{folding}} = \frac{12I_1\tau}{C_{par}V_{os}}$$

For example, if I1=40 uA, Vos=10 mV, Cpar=25 fF, T=3 nS, then SNR=75 dB. For every doubling of clock frequency, the quantization noise of a second order APSDM (active passive sigma delta modulator) improves by 15 dB (78→93). However, the noise from the folding degrades by 6 dB (75→69). Thus it limits the performance.

Embodiments of the invention include a third phase that is introduced to nullify the parasitic capacitance memory that will now be explained with reference to FIGS. 3A and 3B that are a block diagram and a timing diagram, respectively, illustrating three-phase operation of a differential SD-ADC 300 in which parasitic capacitance is reset by the third phase. The general operation of SD-ADC 300 is the same as that of SD-ADC 200 and similarly labeled blocks operate in a similar manner. As described above, parasitic capacitor Cpar 202 stores +Vos or −Vos depending upon output signal Vout from quantizer 254 during the prior cycle X[n], depending on whether Vout is +1 or −1. A third switch 310 is included within DAC 258b that is controlled by a non-overlapping third phase clock signal φ3. φ1, φ2, and φ3 are generated by a clock circuit 320 in a such a manner that all three clock signals are non-overlapping, as illustrated in FIG. 3B. φ3 operates at twice the frequency of φ1 and φ2 such that between each pulse of φ1 and φ2 there is a pulse on φ3 that causes switch 310 to connect parasitic capacitor 202 to a common mode voltage Vcm 312 and thereby reset the parasitic charge on the output of DAC 258b from the prior integration cycle and remove the signal, noise dependent charge and offset from the parasitic capacitor. By doing so, it solves the three problems discussed earlier at once. In this innovative scheme, the parasitic capacitor has common mode voltage, therefore its contribution is also shaped the same as the quantization noise. The SNR and SNDR (signal to noise plus distortion ratio) of the three-phase SD-ADC matches well the mathematical model and shows approximately 6-10 dB improvement in performance.

In this case, folded charge Qfolding is:

$$Q_{folding} = C_{par}V_{os}X[n+1] \approx C_{par}V_{os}Q[n+1] = C_{par}V_{os}Q[f]$$

Thus, the folded noise remains shaped by the delta-sigma loop.

Figure 3A:
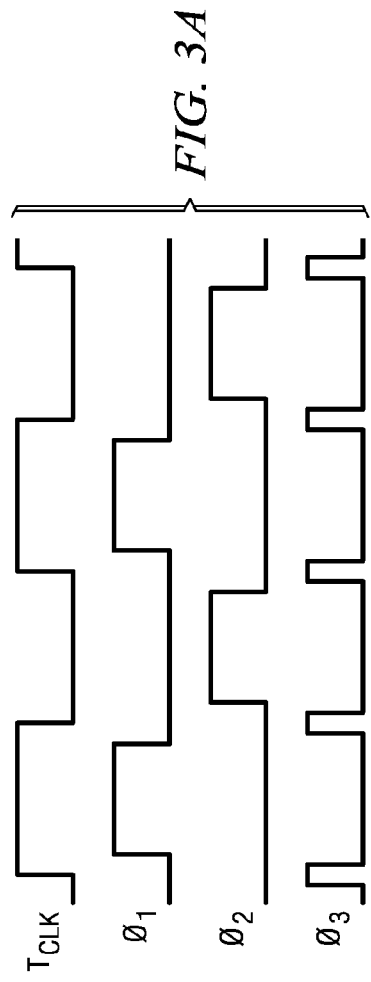
FIGS. 3A and 3B are a block diagram and a timing diagram, respectively, illustrating three-phase operation of a differential SD-ADC with parasitic capacitance initialization.
Figure 3B:
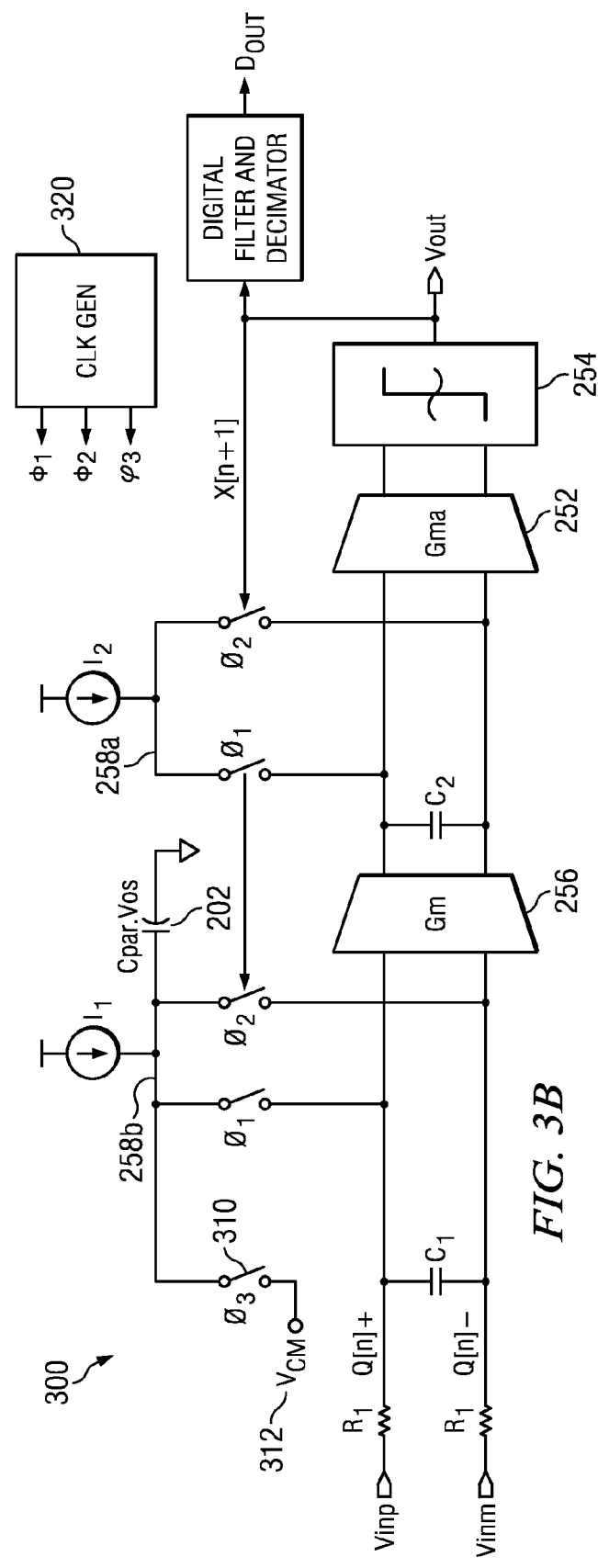

FIG. 3A illustrates initializing of parasitic capacitance within DAC 258b. In a similar manner, parasitic capacitance within DAC 258a may also be reset. The parasitic of second stage DAC 258a sees the same event but its affect when referred back to input sees an attenuation from Gm stage 256 gain. For example, if Gm 256 has a gain of 100, then its affect referred back to input will be 1/100 times smaller. Therefore, some embodiments may include a reset switch controlled by φ3 in both DAC 258a and 258b, while in other embodiments only the first DAC 258b will include an initialization switch.

The embodiment of FIG. 1 also includes circuitry 60 coupled to feedback DAC 58b for initializing parasitic capacitance, as described in more detail above, that may be implemented as described in more detail below. Some embodiments of an SD-ADC may also include a second initialization circuit 61 coupled to DAC 58a, as described in more detail above.

Figure 4:
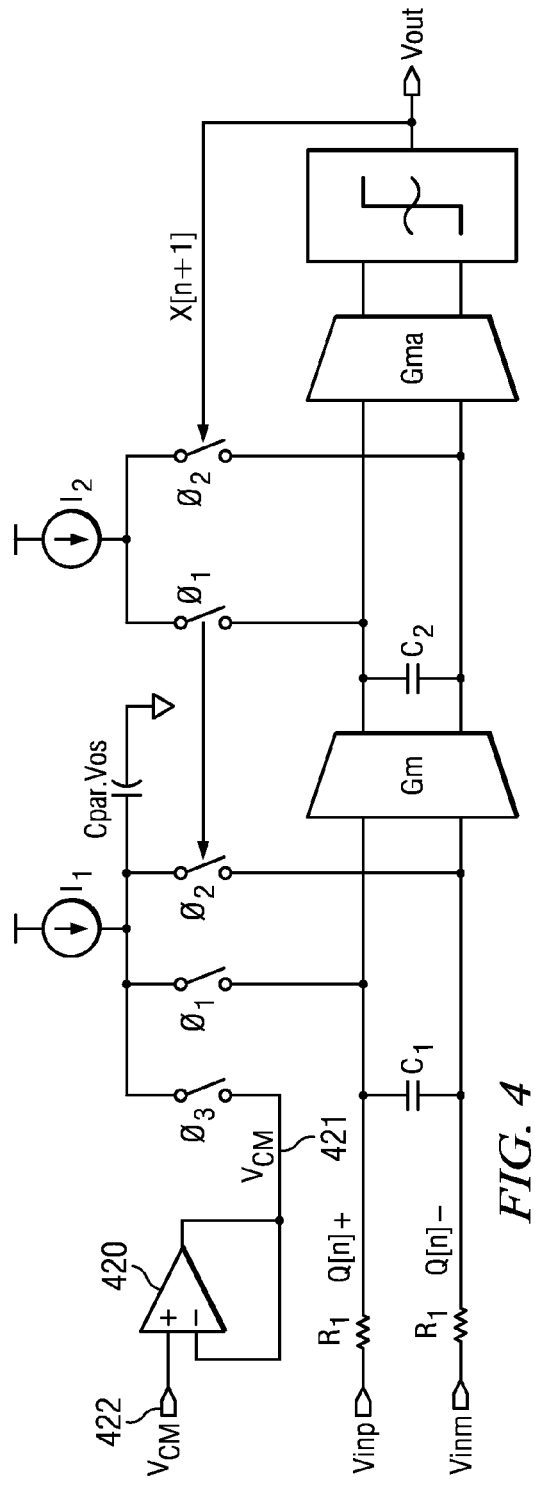
FIGS. 4 and 5 illustrate embodiments of a three-phase differential SD-ADC
Figure 5:
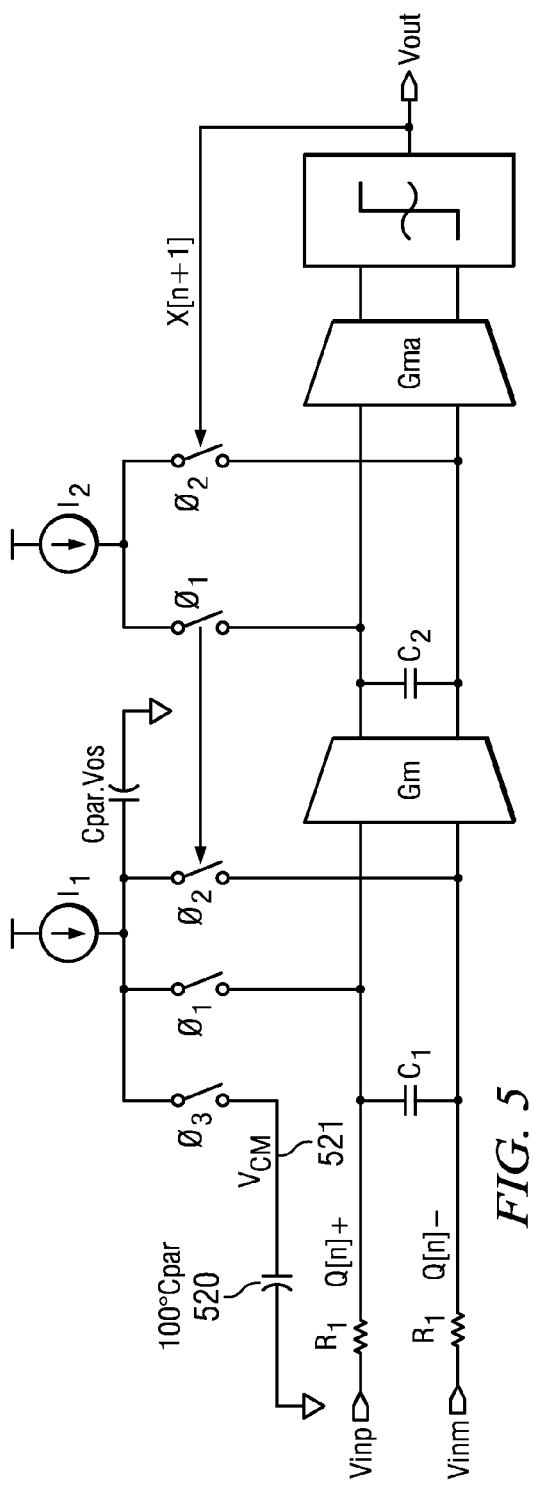

FIGS. 4 and 5 illustrate various embodiments of a three-phase differential SD-ADC of FIG. 3A. FIG. 3A illustrates reset switch 310 connected to common mode node 312. The common mode node provides an AC ground, which may be either logic ground or a DC voltage. FIG. 4 illustrates a DC common mode voltage Vcm 421 produced by buffer 420. Buffer 420 may be an op-amp that is connected as shown to reproduce input voltage signal Vcm 422. Vcm may be selected to have a value that is between the average value of inputs Vinp and Vinm, for example. FIG. 4 illustrates a DC common mode voltage Vcm 421 that is produced by capacitor 420. Capacitor 420 is coupled to logic ground as shown. Capacitor 420 is configured to have a large capacitance relative to parasitic capacitance Cpar. Capacitor 420 may have a capacitance equal to or greater than about 100 times Cpar, for example.

Figure 6:
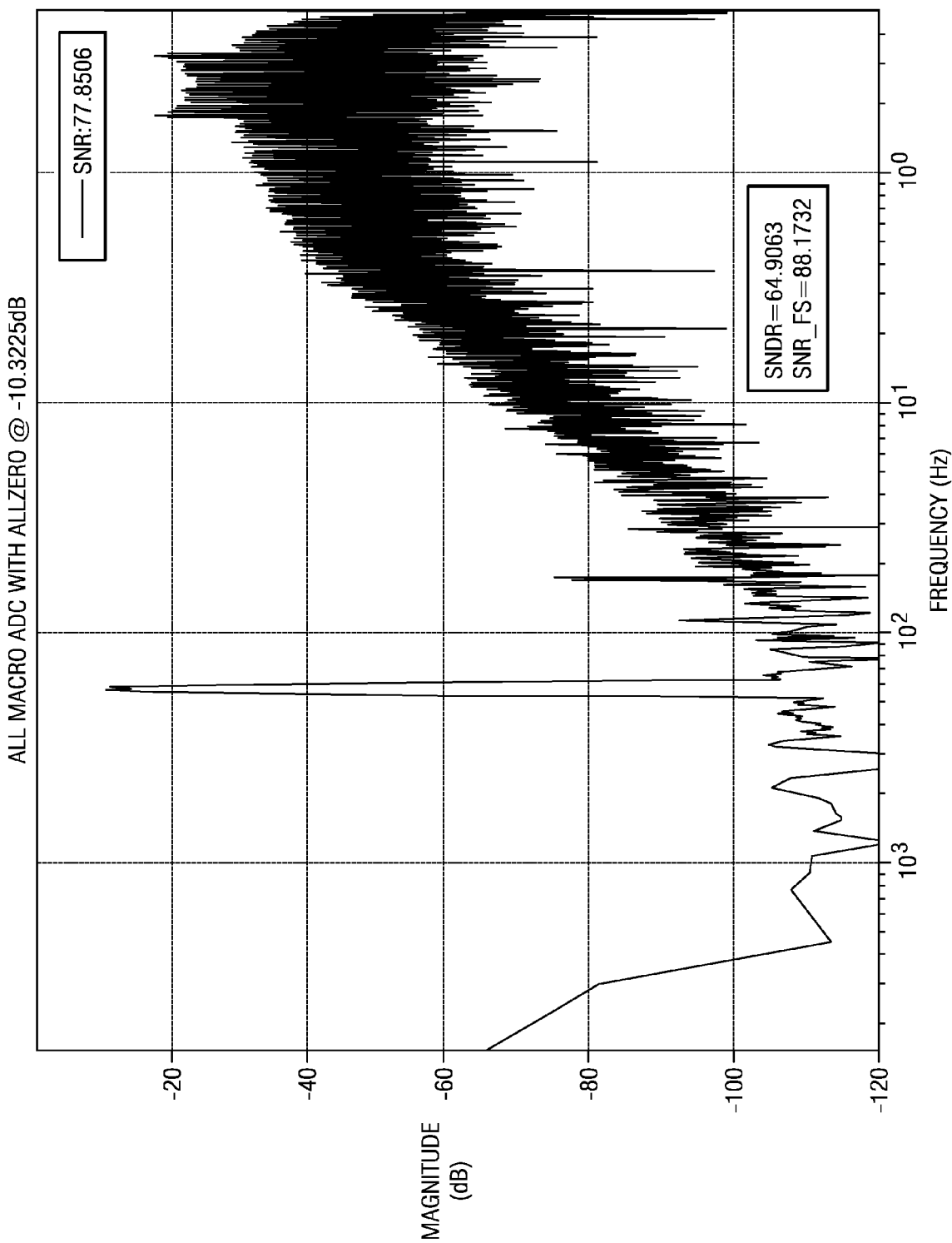
FIGS. 6 and 7 are plots illustrating ideal operation of a $2^{nd}$ order differential SD-ADC and operation of a three phase $2^{nd}$ order differential SD-ADC with parasitic capacitance initialization.
Figure 7:
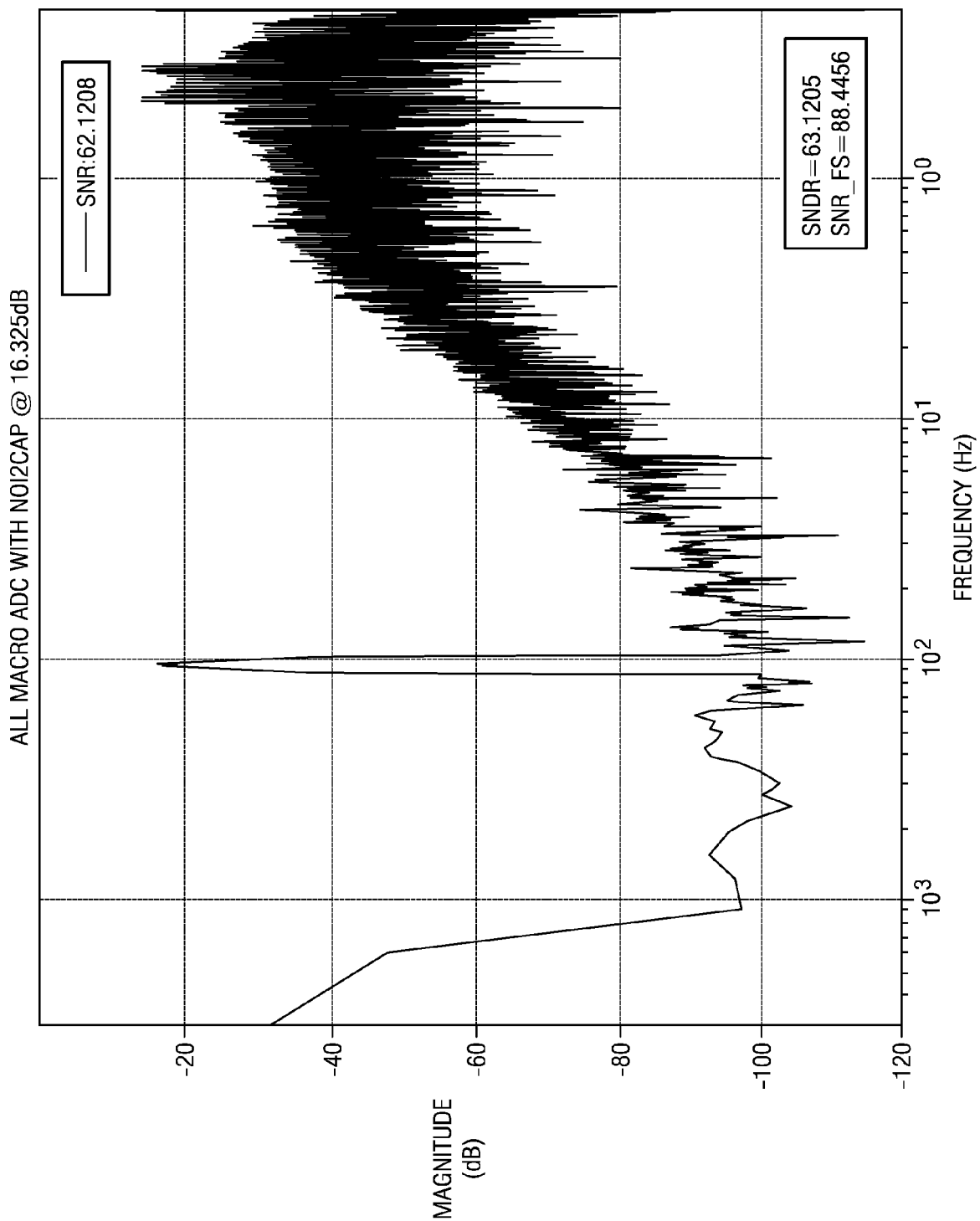

FIGS. 6 and 7 are plots illustrating respectively ideal operation of a $2^{nd}$ order differential SD-ADC and operation of a three phase $2^{nd}$ order differential SD-ADC with parasitic capacitance reset. FIG. 6 illustrates a simulated ideal operation of SD-ADC 300. SNR_FS (signal to noise ratio at the sampling frequency) is 88.2 dB, and SNDR is 64.9 dB. FIG. 7 illustrates actual operation of SD-ADC 300 in which SNR_FS is 88.4 dB and SNDR is 63.1 dB, thanks to resetting of parasitic capacitance as described above with regard to FIG. 4. Actual operation of SD-ADC 200 without resetting parasitic capacitance as described above with regards to FIG. 2 produces a SNR_FS of only 78.7 dB and a SNDR of only 58.4 dB.

Figure 8:
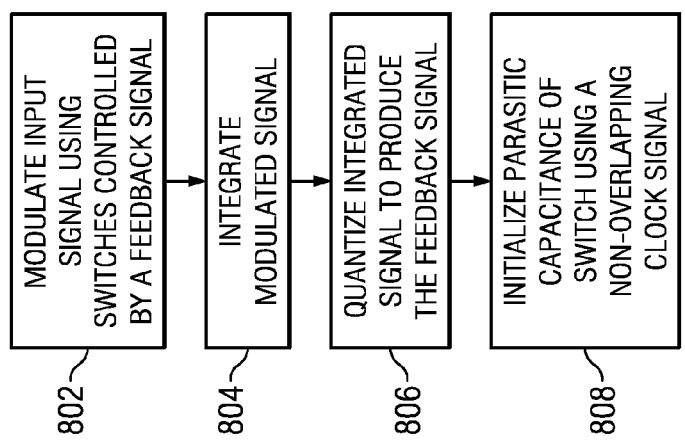
FIG. 8 is a flow diagram illustrating a method for operating the SD-ADC of FIGS. 3A-5.

FIG. 8 is a flow diagram illustrating a method for operating the SD-ADC of FIGS. 4A-6. In general, an input signal is modulated 802 by intermittently coupling a reference signal to the input signal using one or more switches controlled by one or more feedback signals and a respective one or more non-overlapping clock signals, as described in more detail above. The modulated input signal is integrated 804 using an integration capacitor to form an integrated value. The integrated value is compared 806 to a threshold to form the one or more feedback signals. A parasitic capacitance of the switch is initialized 808 to an initial value prior to each intermittent coupling of the reference signal to the input signal using another non-overlapping clock signal. The initial value may be from a common mode node that provides an AC ground, which may be either logic ground or a DC voltage.

In some embodiments, the parasitic capacitance of only a first stage is initialized 808 prior to each intermittent coupling of the reference signal to the input signal using another non-overlapping clock signal. In other embodiments, the parasitic capacitance of two or more stages is initialized 808 prior to each intermittent coupling of the reference signal to the input signal using another non-overlapping clock signal.

Another Embodiment

Figure 9:
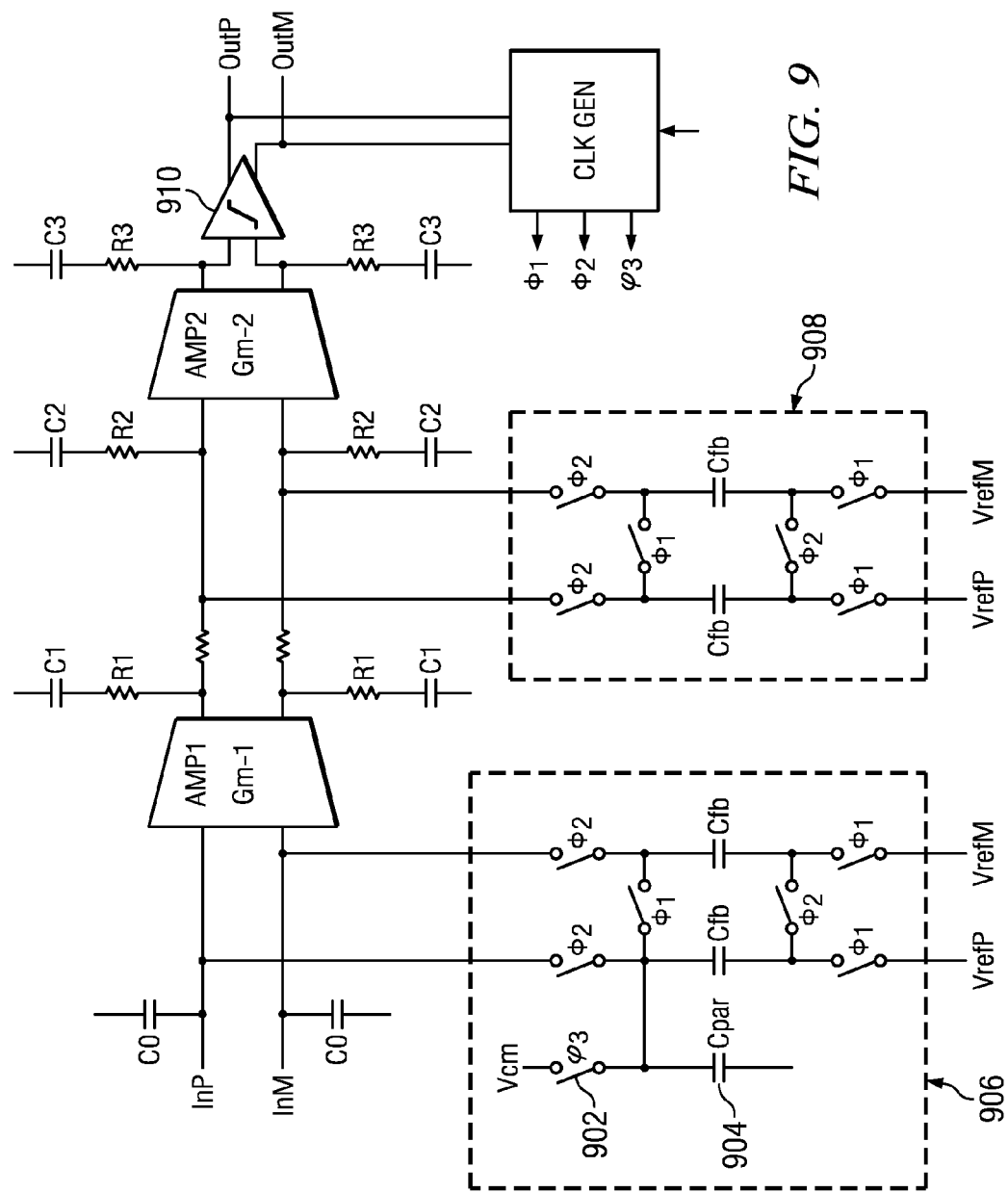
FIG. 9 is a block diagram of a $4^{th}$-order differential SD-ADC with parasitic capacitance initialization.

FIG. 9 is a block diagram of a $4^{th}$-order differential SD-ADC with parasitic capacitance initialization. A 4th-order loop is implemented using just two-amplifiers plus passive components to realize the poles and zeros. This active-passive delta-sigma modulator (APDSM) runs at a sampling rate of 256 MHz. The outer loop has 2-poles and 1-zero, and the inner loop has 2-poles and 2-zeros realized with passive elements. The double loop is designed to minimize internal signal swings. The input to the 1st amplifier (AMP1) is limited to ±15 mV peak and its output is limited to less than ±100 mV peak. The inputs to the 2nd amplifier (AMP2) and to the comparator are limited to ±5 mV peak. These small-signal swings reduce distortion and power consumption, simplify amplifier design, and allow low voltage (1.2V) operation. GM-1, which provides most of the loop gain, is realized by a low voltage, folded-cascode operational transconductance amplifier (OTA). This amplifier has a large differential input pair with non-minimum channel lengths (for reduced offset and flicker noise); hence it also has a large transconductance gain that helps reduce the input referred noise. Any noise coupled inside the inner loop is reduced by the transconductance-resistance Gm-R gain of AMP1. AMP2 serves to decouple the poles and zeros of the inner and outer loops. Thus, passive RC values can be easily determined from loop-gain, bandwidth, signal swing, and absolute A/D gain requirements. AMP2 is implemented using a simple differential pair with non-cascoded loads. The Gm-R gain of AMP2 helps to further suppress the input-referred noise and offset of the comparator. The cascaded Gm-R gain in the forward path allows the comparator to be implemented as a very small, high-speed, regenerative latch comparator without offset cancellation.

The loop filter passive poles and zeros are implemented using NWELL resistors and, PMOS capacitors. This helps to reduce total area due to the large NWELL sheet resistance and the large gate capacitance available in deep sub-micron processes. To allow low-voltage operation, a low common-mode voltage is used throughout the modulator, so using PMOS-gate capacitors helps to reduce non-linearities caused by common-mode voltage variation. In deep sub-micron technologies, gate capacitors present a large capacitance per unit area, with an accurately defined absolute value that shows good matching and low variability over process, voltage, and temperature corners. The SC DAC capacitors are implemented using metal-metal capacitors, which provide very good linearity and matching.

Feedback DACs 906, 908 are implemented with switches controlled by non-overlapping clock signals φ1, φ2 generated in response to feedback signals corresponding to OutP and OutM from quantizer 910. As was described with regard to FIG. 3A, parasitic capacitance 904 associated with feedback DAC 906 is initialized via switch 902 using non-overlapping clock signal φ3, having timing similar to FIG. 3B. In some embodiments, parasitic capacitance (not shown) associated with feedback DAC 908 may also be initialized via a switch (not-shown) using non-overlapping clock signal φ3.

System Examples

Figure 10:
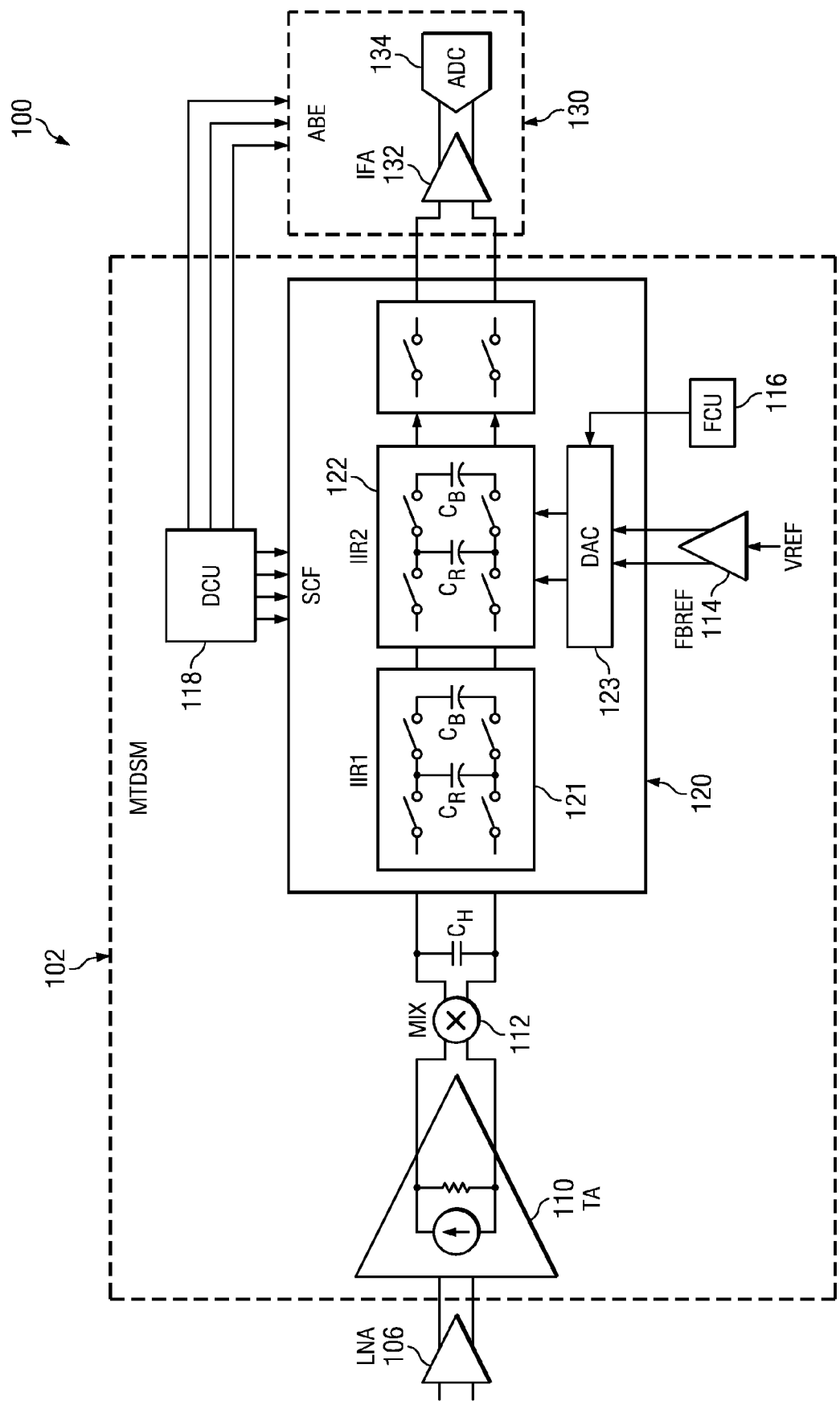
FIG. 10 is a block diagram of a digital radio that embodies a three-phase SD-ADC.

FIG. 10 is a block diagram of a digital system 100 with a delta sigma analog to digital converter 134 which embodies an aspect of the present invention. Digital system 100 is representative of a variety of different systems that are designed for receiving an analog signal, filtering the signal to select a particular frequency band, and then converting the filtered signal to the digital domain for further processing by a digital signal processor. One example of such a system is a radio receiver. Various types of radio receivers have need for selecting a particular frequency and processing a data or audio signal being transmitted on that frequency. A particular embodiment of digital system 100 is in a cellular telephone handset.

Digital system 100 includes an analog front end portion and analog backend portion (ABE) 130. The analog front end includes low noise amplifier 106 that receives a radio frequency (RF) signal from an antenna, not shown, and amplifies the low level signal using low noise amplification techniques. The total gain is limited in order to minimize compression of the later stages which results in degradation to signal to noise ratio (SNR) of the signal under blocking condition due to strong interferers. The amplified RF signal is then connected to multi-tap direct sub-sampling mixing (MTDSM) system 102 for further amplification and filtering.

Transconductance amplifier (TA) 110 produces an analog output signal in which the current is proportional to the input voltage signal. The output of TA 110 is provided to mixer 112 that down mixes the RF signal to a lower intermediate frequency. The output of mixer 112 is developed across holding capacitor $C_H$ and provided to passive switched capacitor filter (SCF) 120. SCF 120 includes two infinite impulse response (IIR) stages IIR1 121 and IIR2 122.

FeedBack REFerence (FBREF) circuit 114 provides a reference voltage signal to digital to analog converter (DAC) 123 that produces an analog common mode voltage used by IIR2. FBREF 114 is basically a voltage buffer for VREF. VREF is provided from a band-gap reference device which is a reference voltage for the whole analog portion 102. In this embodiment, VREF is approximately 0.9 v. Feedback control unit (FCU) 116 is a sigma-delta modulator that controls DAC 123. Digital control unit (DCU) 118 generates the timing signals used to control the various MOSFET switches within SCF 120 and ABE 130. In this embodiment, DCU 118 generates a series of non-overlapping timing signals using a shift register circuit.

An output of SCF 120 is provided to ABE 130. ABE 130 includes intermediate frequency amplifier (IFA) 132 that further amplifies the signal produced by SCF 120 that is then connected to analog to digital converter (ADC) 134. ADC 134 samples and converts the continuous time signal to a digital signal that is then provided to a digital signal processing (DSP) unit, not shown, for further processing. ADC 134 is an embodiment of the present invention and includes parasitic capacitance initialization as described in more detail above. ADC 134 also uses the common mode voltage produced by DAC 123 from VREF for initializing the parasitic capacitance. The non-overlapping timing signals generated by DCU 118 includes three non-overlapping signals as illustrated in FIG. 3B used by ADC 134 for operation of the feedback loop and for initialization of the parasitic capacitance, as described in more detail above.

Due to noise generated by the conversion processes in ABE 130, a sufficient input signal to ABE 130 is needed to maintain certain SNR required for digital base band (DBB) processing. The analog front end (AFE) circuits must provide sufficient gain while maintaining a good front-end linearity. In this embodiment, SCF 120 is dynamically configurable in order to better support different wireless standards. This enables support of different standards such as GSM and W-CDMA.

Figure 11:
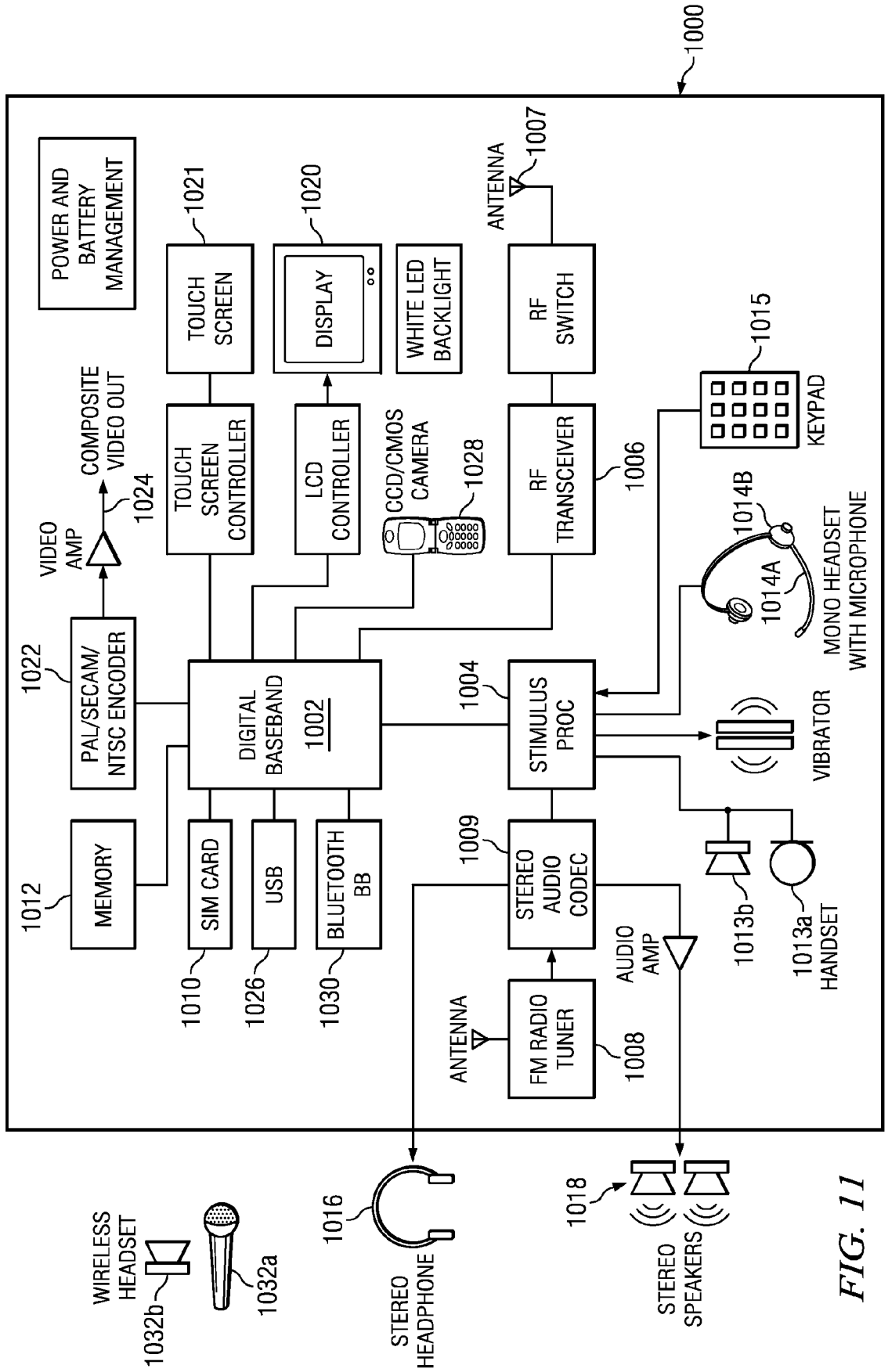
FIG. 11 is a more detailed block diagram of a cell phone using the digital radio of FIG. 10 that embodies a three-phase SD-ADC.

FIG. 11 is a block diagram of mobile cellular phone 1000 for use in a cellular network. Digital baseband (DBB) unit 1002 can include a digital processing processor system (DSP) that includes embedded memory and security features. Stimulus Processing (SP) unit 1004 receives a voice data stream from handset microphone 1013a and sends a voice data stream to handset mono speaker 1013b. SP unit 1004 also receives a voice data stream from microphone 1014a and sends a voice data stream to mono headset 1014b. Usually, SP and DBB are separate ICs. In most embodiments, SP performs processing based on configuration of audio paths, filters, gains, etc being setup by software running on the DBB. In an alternate embodiment, SP processing is performed on the same processor that performs DBB processing. In another embodiment, a separate DSP or other type of processor performs SP processing.

RF transceiver 1106 is a digital radio processor and includes a receiver for receiving a stream of coded data frames from a cellular base station via antenna 1107 and a transmitter for transmitting a stream of coded data frames to the cellular base station via antenna 1107. RF transceiver 1106 is connected to DBB 1102 which provides processing of the frames of encoded data being received and transmitted by cell phone 1100. RF transceiver 1106 includes a digital radio receiver with an SC-ADC having parasitic capacitance initialization, as described above in more detail with reference to FIG. 10.

DBB unit 1002 may send or receive data to various devices connected to universal serial bus (USB) port 1026. DBB 1002 can be connected to subscriber identity module (SIM) card 1010 and stores and retrieves information used for making calls via the cellular system. DBB 1002 can also connected to memory 1012 that augments the onboard memory and is used for various processing needs. DBB 1002 can be connected to Bluetooth baseband unit 1030 for wireless connection to a microphone 1032*a* and headset 1032*b* for sending and receiving voice data. DBB 1002 can also be connected to display 1020 and can send information to it for interaction with a user of the mobile UE 1000 during a call process. Display 1020 may also display pictures received from the network, from a local camera 1026, or from other sources such as USB 1026. DBB 1002 may also send a video stream to display 1020 that is received from various sources such as the cellular network via RF transceiver 1006 or camera 1026. DBB 1002 may also send a video stream to an external video display unit via encoder 1022 over composite output terminal 1024. Encoder unit 1022 can provide encoding according to PAL/SECAM/NTSC video standards. In some embodiments, audio codec 1109 receives an audio stream from FM Radio tuner 1108 and sends an audio stream to stereo headset 1116 and/or stereo speakers 1118. In other embodiments, there may be other sources of an audio stream, such a compact disc (CD) player, a solid state memory module, etc.

Other Embodiments

While the invention has been described with reference to illustrative embodiments, this description is not intended to be construed in a limiting sense. Various other embodiments of the invention will be apparent to persons skilled in the art upon reference to this description. For example, various embodiments may be designed with various combinations of poles and zeros to optimize operation in a particular frequency and sampling range.

While FIG. 1 illustrates an SD-ADC with one amplifier, FIG. 3A illustrates a $2^{nd}$ order SD-ADC with two amplifiers and FIG. 9 illustrates a $4^{th}$ order SD-ADC with two amplifiers, other embodiments may have additional active or passive stages with or without additional amplifiers. Parasitic capacitance of only the first stage may be initialized as described above, or parasitic of two or more stages may be initialized as described above.

While a mobile handset has been described, embodiments of the invention are not limited to cellular phone devices. Various personal devices such as audio players, video players, radios, televisions, personal digital assistants (PDA) may use an embodiment of the invention to produce superior analog to digital conversion.

Although the invention finds particular application to systems using Digital Signal Processors (DSPs), implemented, for example, in an Application Specific Integrated Circuit (ASIC), it also finds application to other forms of processors. An ASIC may contain one or more megacells which each include custom designed functional circuits combined with pre-designed functional circuits provided by a design library.

An embodiment of the invention may include a system with a processor coupled to a computer readable medium in which a software program is stored that contains instructions that when executed by the processor perform the functions of modules and circuits described herein. The computer readable medium may be memory storage such as dynamic random access memory (DRAM), static RAM (SRAM), read only memory (ROM), Programmable ROM (PROM), erasable PROM (EPROM) or other similar types of memory. The computer readable media may also be in the form of magnetic, optical, semiconductor or other types of discs or other portable memory devices that can be used to distribute the software for downloading to a system for execution by a processor. The computer readable media may also be in the form of magnetic, optical, semiconductor or other types of disc unit coupled to a system that can store the software for downloading or for direct execution by a processor.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. A method of operating a sigma delta modulator, comprising:
   modulating an input signal by intermittently coupling a reference signal to the input signal using one or more switches controlled by one or more feedback signals and a respective one or more non-overlapping clock signals;
   integrating the modulated input signal using an integration capacitor to form an integrated value;
   amplifying the integrated value;
   comparing the integrated value to a threshold to form the one or more feedback signals; and
   initializing a parasitic capacitance of the one or more switches to an initial value prior to each intermittent coupling of the reference signal to the input signal using a third non-overlapping clock signal.

2. The method of claim 1, wherein the reference signal is a common mode voltage.

3. The method of claim 1, wherein the reference signal is an AC connection to ground.

4. The method of claim 3, wherein the AC connection to ground is via a capacitor having a value greater than approximately 100 times the parasitic capacitance.

5. The method of claim 1, wherein the one or more non-overlapping clock signals comprise a first clock signal and a non-overlapping second clock signal, each having a first pulse rate, and the third non-overlapping clock signal has a pulse rate equal to twice the first pulse rate.

6. The method of claim 5, wherein each pulse of the third non-overlapping clock signal is positioned between each pulse of the first clock signal and the second clock signal, such that none of the pulses overlap another pulse.

7. The method of claim 1, further comprising:
modulating the amplified integrated value by intermittently coupling a reference signal to the amplified integrated value using a second set of one or more switches controlled by one or more feedback signals and a respective one or more non-overlapping clock signals; and
initializing a parasitic capacitance of the second set of one or more switches to an initial value prior to each intermittent coupling of the reference signal to the amplified integrated value using another non-overlapping clock signal.

8. A system comprising a sigma delta modulator, the modulator comprising:
feedback circuitry configured to modulate an input signal by intermittently coupling a reference signal to the input signal using one or more switches controlled by one or more feedback signals and a respective one or more non-overlapping clock signals;
filter circuitry configured to integrate the modulated input signal using an integration capacitor to form an integrated value;
quantizer circuitry coupled to the filter configured to compare the integrated value to a threshold to form the one or more feedback signals; and
initialization circuitry coupled to the feedback circuitry configured to initialize a parasitic capacitance of the one or more switches to an initial value prior to each intermittent coupling of the reference signal to the input signal using a third non-overlapping clock signal.

9. The modulator of claim 8, wherein the reference signal is a common mode voltage.

10. The modulator of claim 8, wherein the reference signal is an AC connection to ground.

11. The modulator of claim 10, wherein the AC connection to ground is via a capacitor having a value greater than approximately 100 times the parasitic capacitance.

12. The modulator of claim 8, further comprising clock generation circuitry configured to generate the one or more non-overlapping clock signals, wherein the one or more non-overlapping clock signals comprise a first clock signal and a non-overlapping second clock signal, each having a first pulse rate, and the third non-overlapping clock signal has a pulse rate equal to twice the first pulse rate.

13. The modulator of claim 12, wherein the clock generation circuitry is configured to position each pulse of the third non-overlapping clock signal between each pulse of the first clock signal and the second clock signal, such that none of the pulses overlap another pulse.

14. The modulator of claim 8, further comprising an amplifier coupled to the filter circuitry configured to amplify the integrated value provided to the quantizer circuitry.

15. The modulator of claim 14, further comprising:
second feedback circuitry coupled to the amplifier configured to modulate the amplified integrated value by intermittently coupling a reference signal to the amplified integrated value using a second set of one or more switches controlled by one or more feedback signals and a respective one or more non-overlapping clock signals; and
second initialization circuitry coupled to the second feedback circuitry configured to initialize a parasitic capacitance of the second set of one or more switches to an initial value prior to each intermittent coupling of the reference signal to the amplified integrated value using the third non-overlapping clock signal.

16. The system of claim 8 being a digital radio, wherein the modulator is an analog to digital converter, further comprising an analog front end module coupled to the modulator for providing the input signal.

17. The system of claim 16 being a cellular telephone, further comprising a digital processing system coupled to an output of the analog to digital converter.

* * * * *